(12) United States Patent
Wang et al.

(10) Patent No.: US 9,231,098 B2
(45) Date of Patent: Jan. 5, 2016

(54) MECHANISM FOR FORMING METAL GATE STRUCTURE

(71) Applicant: Taiwan Semiconductor Manufacturing Co., Ltd, Hsin-Chu (TW)

(72) Inventors: Tien-Chun Wang, Hsinchu (TW); Yi-Chun Lo, Zhubei (TW); Chia-Der Chang, Hsinchu (TW); Guo-Chiang Chi, Zhubei (TW); Chia-Ping Lo, Jhubei (TW); Fu-Kai Yang, Hsinchu (TW); Hung-Chang Hsu, Kaohsiung (TW); Mei-Yun Wang, Chu-Pei (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 14/067,154

(22) Filed: Oct. 30, 2013

(65) Prior Publication Data

US 2015/0115335 A1 Apr. 30, 2015

(51) Int. Cl.
*H01L 21/311* (2006.01)
*H01L 29/78* (2006.01)
*H01L 29/66* (2006.01)
*H01L 21/768* (2006.01)
*H01L 21/3115* (2006.01)

(52) U.S. Cl.
CPC .............. *H01L 29/78* (2013.01); *H01L 29/665* (2013.01); *H01L 21/3115* (2013.01); *H01L 21/76802* (2013.01)

(58) Field of Classification Search
CPC ....................... H01L 21/76802; H01L 21/3115
See application file for complete search history.

(56) References Cited

U.S. PATENT DOCUMENTS

| 6,610,594 B2* | 8/2003 | Apelgren | H01L 21/31155 257/E21.248 |
| 2007/0210454 A1* | 9/2007 | Chou | H01L 21/76802 257/758 |
| 2008/0124919 A1* | 5/2008 | Huang | H01L 21/02063 438/643 |
| 2010/0320547 A1* | 12/2010 | Ando | H01L 21/28088 257/411 |
| 2012/0139049 A1* | 6/2012 | Kanike | H01L 28/20 257/350 |
| 2014/0103404 A1* | 4/2014 | Li | H01L 21/823842 257/288 |

* cited by examiner

*Primary Examiner* — Matthew W Such
*Assistant Examiner* — Ali Naraghi
(74) *Attorney, Agent, or Firm* — Birch, Stewart, Kolasch & Birch, LLP

(57) ABSTRACT

Embodiments of mechanisms for forming a semiconductor device are provided. The semiconductor device includes a semiconductor substrate. A source region and a drain region are formed in the semiconductor substrate, and metal silicide regions are formed in the source region and the drain region, respectively. The semiconductor device further includes a metal gate stack formed over the semiconductor substrate and between the source region and the drain region. The semiconductor device also includes an insulating layer formed over the semiconductor substrate and surrounding the metal gate stack, wherein the insulating layer has contact openings exposing the metal silicide regions, respectively. The semiconductor device includes a dielectric spacer liner layer formed over inner walls of the contact openings, wherein the whole of the dielectric spacer liner layer is right above the metal silicide regions. The semiconductor device includes contact plugs formed in the contact openings.

20 Claims, 5 Drawing Sheets

MECHANISM FOR FORMING METAL GATE STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

For a more complete understanding of the embodiments, and the advantages thereof, reference is now made to the following descriptions taken in conjunction with the accompany drawings.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact. Some variations of the embodiments are described. Throughout the various views and illustrative embodiments, like reference numbers are used to designate like elements.

Figure 1A:
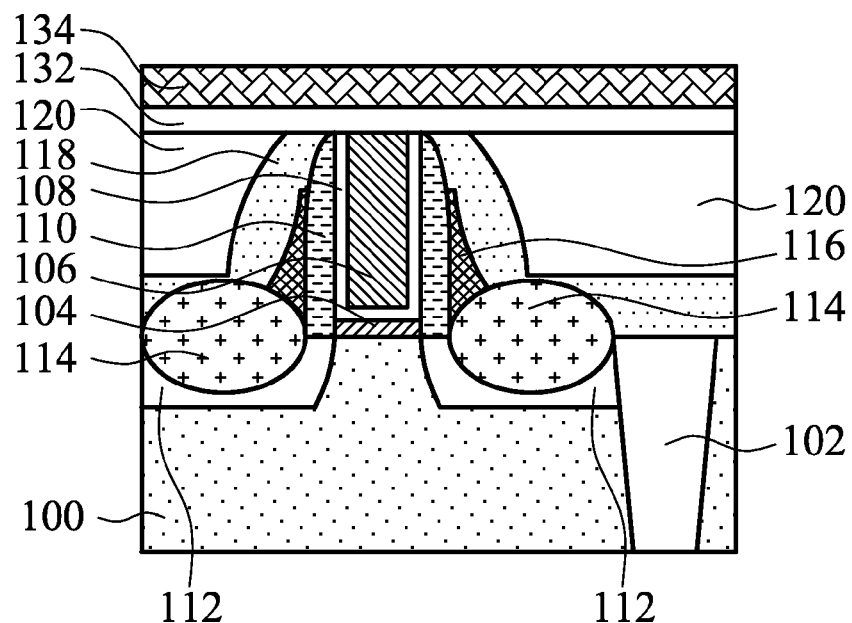
FIGS. 1A-1D are cross-sectional views of various stages of a process for forming a semiconductor device, in accordance with some embodiments.

FIGS. 1A-1D are cross-sectional views of various stages of a process for forming a semiconductor device, in accordance with some embodiments. Referring to FIG. 1A, a semiconductor substrate 100 is provided. The semiconductor substrate 100 may be a semiconductor wafer (such as a silicon wafer) or a portion of a semiconductor wafer.

In some embodiments, the semiconductor substrate 100 is made of an elementary semiconductor material including silicon or germanium in a single crystal, polycrystal, or amorphous structure. In some other embodiments, the semiconductor substrate 100 is made of a compound semiconductor, such as silicon carbide, gallium arsenide, gallium phosphide, indium phosphide, indium arsenide, an alloy semiconductor, such as SiGe, or GaAsP, or combinations thereof. The semiconductor substrate 100 may also include multi-layer semiconductors, semiconductor on insulator (SOI) (such as silicon on insulator or germanium on insulator), or combinations thereof.

An isolation structure 102 is formed in the semiconductor substrate 100 to define various active regions in the semiconductor substrate 100, and to electrically isolate neighboring devices (e.g. transistors) from one another. The isolation structure 102 may be made of a dielectric material, such as silicon oxide, silicon nitride, silicon oxynitride, fluoride-doped silicate glass (FSG), a low-K dielectric material, other suitable materials, or combinations thereof. The isolation structure 102 may be formed by using an isolation technology, such as local oxidation of semiconductor (LOCOS), shallow trench isolation (STI), or the like.

In some embodiments, the formation of the isolation structure 102 includes patterning the semiconductor substrate 100 by a photolithography process, etching a trench in the semiconductor substrate 100 (for example, by using a dry etching, wet etching, plasma etching process, or combinations thereof), and filling the trench (for example, by using a chemical vapor deposition process) with the dielectric material. In some embodiments, the filled trench may have a multi-layer structure, such as a thermal oxide liner layer filled with silicon nitride or silicon oxide.

As shown in FIG. 1A, a gate dielectric layer 104 and a gate electrode 106 are formed over the semiconductor substrate 100. The gate dielectric layer 104 may be made of a dielectric material, such as a high dielectric constant (high-k) material. The high-k material may be made of hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof. The gate dielectric layer 104 may be formed by an atomic layer deposition (ALD) process, a chemical vapor deposition (CVD) process, or other suitable processes.

The gate electrode 106 (also called a metal gate electrode) is formed by a gate-last approach or a replacement-gate (RPG) approach. The gate electrode 106 may be made of a suitable metal material, such as aluminum, tungsten, gold, platinum, cobalt, other suitable metal, alloy thereof, or combinations thereof. The gate electrode 106 may be deposited by using a PVD process, CVD process, plating process, the like, or combinations thereof.

As shown in FIG. 1A, the gate electrode 106 is formed between the spacers 110, which are previously formed. The spacers 110 may be made of a dielectric material, such as silicon nitride layer, silicon oxynitride layer, or combinations thereof. The structure of the spacers 110 shown in FIG. 1A is merely an example. Other configurations of the spacers 110 are also possible. For example, a sealing layer (not shown) is formed between the spacers 110 and the gate electrode 106.

In some embodiments, a work function metal layer 108 is formed between the spacers 110 and the gate electrode 106 and between the gate electrode 106 and the gate dielectric layer 104. The work function metal layer 108 provides desired work function for transistors to enhance device performance including improved threshold voltage. In the embodiments of forming an NMOS transistor, the work function metal layer 108 can be an n-type metal. The n-type metal may be made of tantalum, tantalum nitride, or combinations thereof.

On the other hand, in the embodiments of forming a PMOS transistor, the work function metal layer 108 can be a p-type metal. The p-type metal may be made of titanium, titanium nitride, other suitable materials, or combinations thereof.

The work function metal layer 108 may also be made of hafnium, zirconium, titanium, tantalum, aluminum, metal carbides (e.g., hafnium carbide, or zirconium carbide), aluminides, ruthenium or combinations thereof. The work function metal layer 108 may be deposited by using a PVD process, CVD process, ALD process, plating process, another suitable method, or combinations thereof.

Doped regions 112 may be formed in the semiconductor substrate 100 by using a suitable process, such as an ion implantation process. The doped regions 112 may be a heavily doped source region and a heavily doped drain region.

Stressors 114 may be formed in the doped regions 112 by using suitable processes. The suitable processes include, for example, an etching process for removing a portion of the semiconductor substrate 100 and a selective epitaxial growth (SEG) process. Depending on the desired type of the resulting MOS device, either stressors applying a compressive stress to the channel region (such as SiGe stressors) or stressors applying a tensile stress to the channel region (such as SiC stressors) are formed.

Spacer oxide layers 116 may be formed over the spacers 110 and the stressors 114 by using, for example, a chemical vapor deposition process. The spacer oxide layers 116 may fill the gaps between the spacers 110 and the stressors 114 to facilitate films subsequently formed to cover the spacers 110 and the stressors 114 smoothly. However, in some embodiments, the spacer oxide layers 116 are optional.

A contact etch stop layer 118 is formed over the semiconductor substrate 100 and sidewalls of the spacers 110, in accordance with some embodiments. The contact etch stop layer 118 may be made of a dielectric material, such as silicon nitride. The contact etch stop layer 118 may be conformally formed on the sidewalls of the spacers 110, the sidewalls of the spacer oxide layers 116, and the semiconductor substrate 100. However, in some embodiments, the contact etch stop layer 118 is not needed.

As shown in FIG. 1A, an insulating layer 120 is then deposited over the semiconductor substrate 100, in accordance with some embodiments. The gate electrode 106, the work function metal layer 108, and the gate dielectric layer 104 together form a gate stack (i.e., a metal gate stack), which is surrounded by the insulating layer 120.

The insulating layer 120 may be made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof. The insulating layer 120 may be deposited by any suitable process, such as a CVD process, HDPCVD process, spin-on process, sputtering process, or combinations thereof.

A stop layer 132 (also called an insulating layer or a dielectric layer) is deposited over the insulating layer 120, the contact etch stop layer 118, the work function metal layer 108, and the gate electrode 106, in accordance with some embodiments. The stop layer 132 may be made of silicon nitride or other suitable materials.

A protective layer 134 is formed on the stop layer 132 to protect the stop layer 132 from being damaged during subsequent processes, such as a pre-amorphized implantation (PAI) process, in accordance with some embodiments. The protective layer 134 is made of, for example, a plasma-enhanced oxide (PEOX) layer.

Figure 1B:
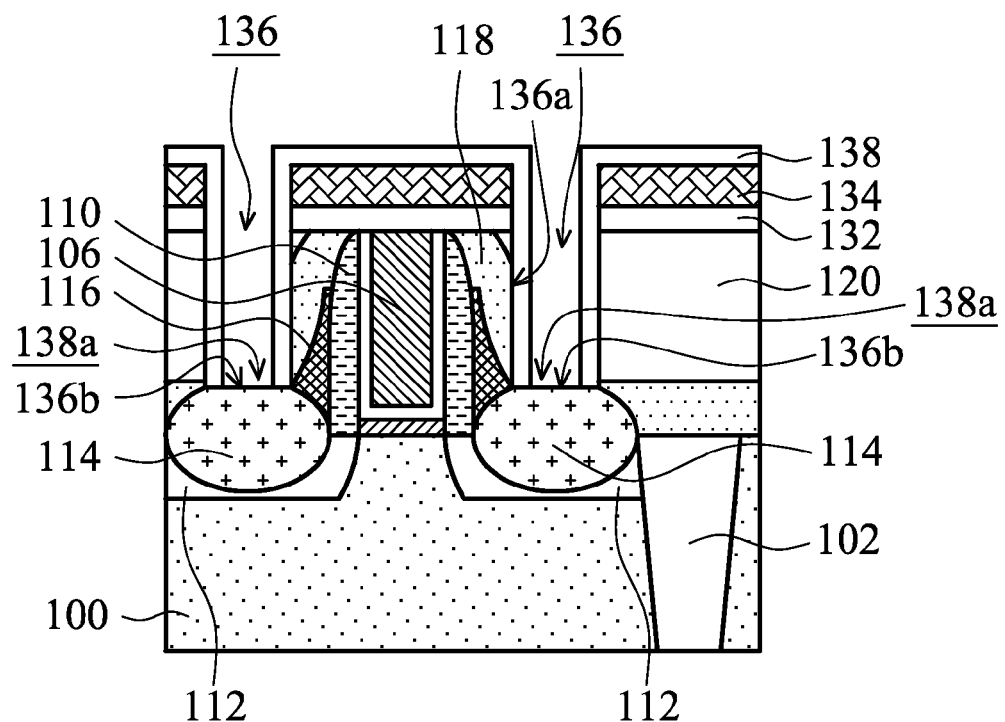

Thereafter, as shown in FIG. 1B, the protective layer 134, the stop layer 132, the insulating layer 120, and the contact etch stop layer 118 may be partially removed to form contact openings 136 exposing the stressors 114 respectively by using a photolithography process and an etching process.

Thereafter, a dielectric spacer liner (DSL) layer 138 is conformally deposited on the protective layer 134 and the sidewalls 136a and the bottoms 136b of the contact openings 136, in accordance with some embodiments. The DSL layer 138 may be made of SiOC or other suitable materials. The DSL layer 138 is deposited by, for example, an atomic layer deposition process or other suitable processes.

Afterwards, an etching process is performed to remove a portion of the DSL layer 138 on the bottoms 136b of the contact openings 136 so as to form holes 138a of the DSL layer 138. The holes 138a expose the stressors 114 at the bottoms 136b of the contact openings 136. The etching process includes, for example, an argon plasma etching process.

Thereafter, a cleaning process may be performed to clean the residues from the etching process of the DSL layer 138. The cleaning process includes, for example, an APM cleaning process using a cleaning solution containing $NH_4OH$, $H_2O_2$, and $H_2O$.

Figure 1C:
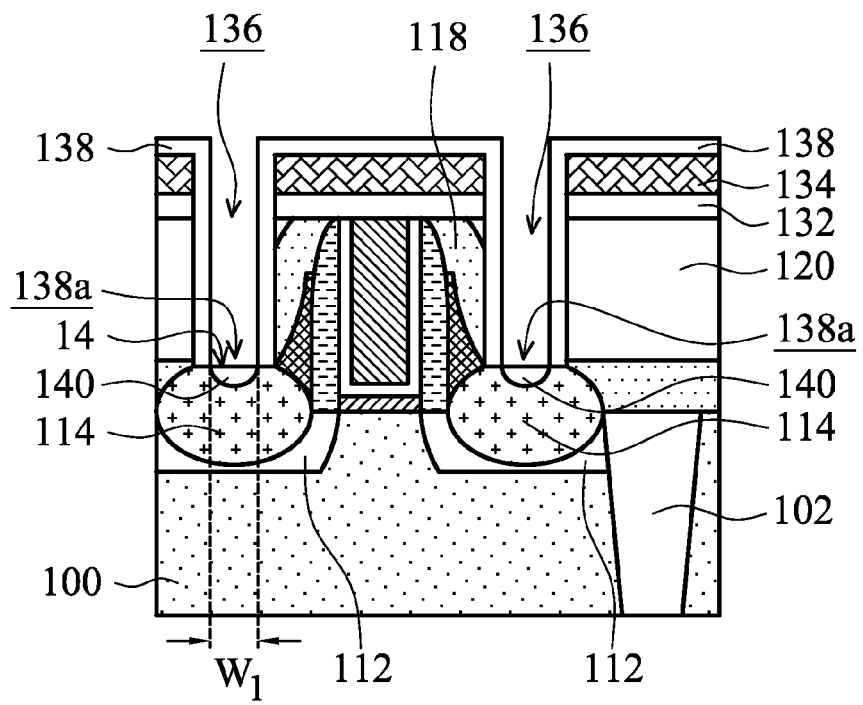

Afterwards, as shown in FIG. 1C, a pre-amorphized implantation (PAI) process is performed to turn the stressors 114 exposed by the holes 138a into amorphous regions 140, in accordance with some embodiments. The PAI process may enhance dopant activation. The PAI prevents subsequently doped impurities from channeling through spaces within the crystal lattice structure and reaching depths greater than desired. In some embodiments, silicon, germanium or carbon is used. In some other embodiments, inert gases, such as neon, argon, krypton, xenon, and/or radon, are used. The top surfaces 14 of the amorphous regions 140 are exposed by the contact openings 136.

Figure 1D:
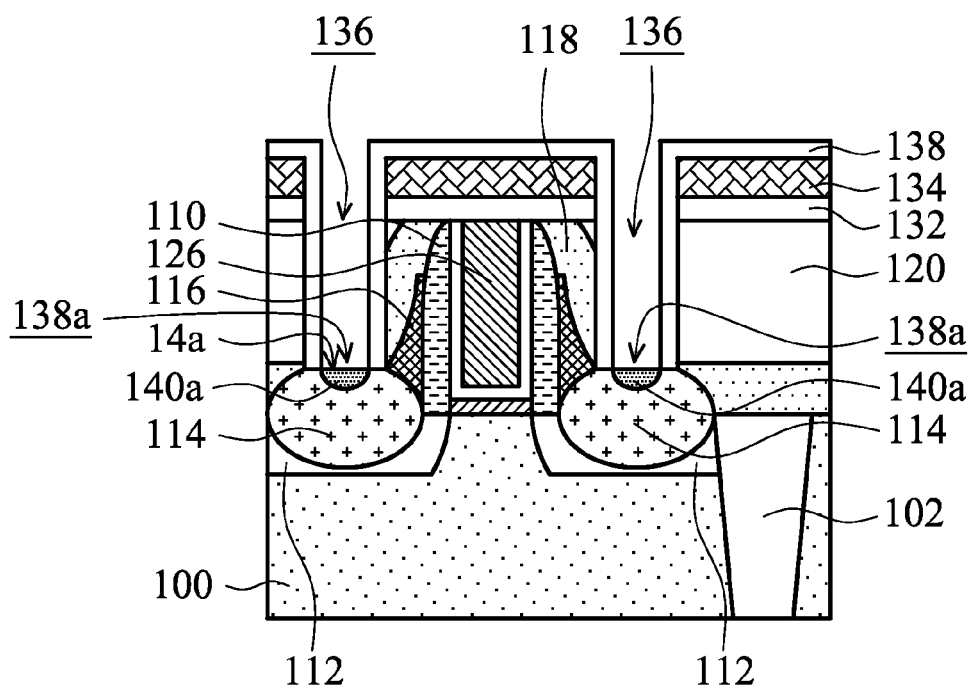

Thereafter, as shown in FIG. 1D, a salicidation (self-aligned silicidation) process is performed on the amorphous regions 140 to turn the amorphous regions 140 into metal silicide regions 140a, in accordance with some embodiments. The material of the metal silicide regions 140a may include nickel silicide. In some embodiments, the metal silicide regions 140a are made of a silicide material of a suitable metal material. The suitable metal material may include cobalt (Co), nickel (Ni), platinum (Pt), titanium (Ti), ytterbium (Yb), molybdenum (Mo), erbium (Er), or combinations thereof. The top surfaces 14a of the metal silicide regions 140a are exposed by the contact openings 136.

Then, an un-reacted portion of a deposited metal film (not shown) for forming the metal silicide regions 140a is removed by using, for example, an etching process. The etching process may include a wet etching process, dry etching process, or combinations thereof. In some embodiments, a wet etching process is adopted to remove the un-reacted metal film. An etchant, such as hot phosphoric acid, is chosen to remove the un-reacted portion of the metal film.

However, as shown in FIG. 1C, the size of the amorphous regions 140 is constrained by the size of the holes 138a of the DSL layer 138. The amorphous regions 140 may be too small to prevent subsequently doped impurities from channeling through spaces within the crystal lattice structure and reaching depths greater than desired. If the doped impurities reach depths greater than desired, the $I_{on}/I_{off}$ ratio may be reduced.

Besides, the size of the amorphous regions 140 constrains the size of the metal silicide regions 140a. Therefore, the metal silicide regions 140a with a small size may result in a high contact resistance between the metal silicide regions 140a and contact plugs subsequently formed. Therefore, it is desirable to form the amorphous regions 140 with a sufficient size.

FIGS. 2A-2E are cross-sectional views of various stages of a process for forming a semiconductor device, in accordance with some embodiments.

A semiconductor structure the same as (or similar to) that shown in FIG. 1A is provided. Thereafter, as show in FIG. 2A, the protective layer 134, the stop layer 132, the insulating layer 120 and the contact etch stop layer 118 are partially removed to form contact openings 136 exposing the stressors 114, respectively, in accordance with some embodiments.

Afterwards, a first PAI process (also called a pre-DSL PAI process) is performed to turn the stressors 114 exposed by the contact openings 136 into amorphous regions 240. Because the first PAI process is performed before the formation of a DSL layer, the amorphous regions 240 are not constrained by the DSL layer. Therefore, the width $W_2$ of the amorphous regions 240 is larger than the width $W_1$ of the amorphous regions 140 as shown in FIG. 1C.

In some embodiments, the width $W_2$ of the amorphous region 240 is larger than the diameter $d_1$ of the contact opening 136. In some embodiments, the ratio of the width $W_2$ to the diameter $d_1$ ($W_2/d_1$) ranges from about 1.3 to about 2.3. In some embodiments, the contact openings 136 merely expose a portion of top surfaces 24 of the amorphous regions 240, respectively.

In some embodiments, phosphorus (P), xenon (Xe), carbon (C), germanium (Ge), boron fluoride ($BF_2$), arsenic (As), or fluorine (F) is used in the first PAI process. In some embodiments, the implantation energy of the first PAI process ranges from about 1 KeV to about 10 KeV. In some embodiments, the implantation dose of the first PAI process ranges from about 500E3 $cm^{-3}$ to about 500E7 $cm^{-3}$. In some embodiments, the implantation angle of the first PAI process ranges from about 0° to about 30°, wherein the implantation angle is relative to a normal line of the top surfaces 24 of the amorphous regions 240.

Figure 2A:
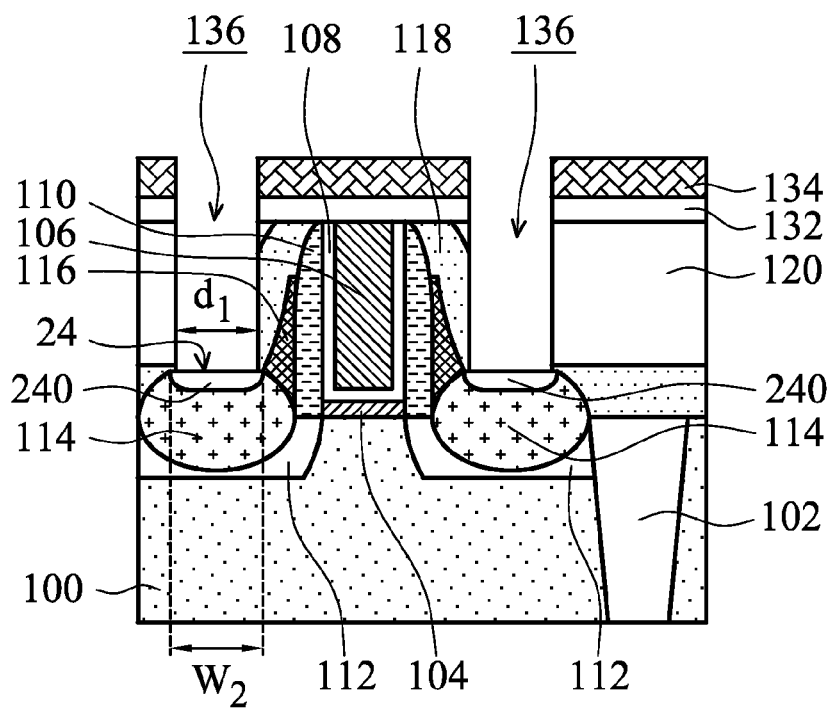
FIGS. 2A-2E are cross-sectional views of various stages of a process for forming a semiconductor device, in accordance with some embodiments.
Figure 2B:
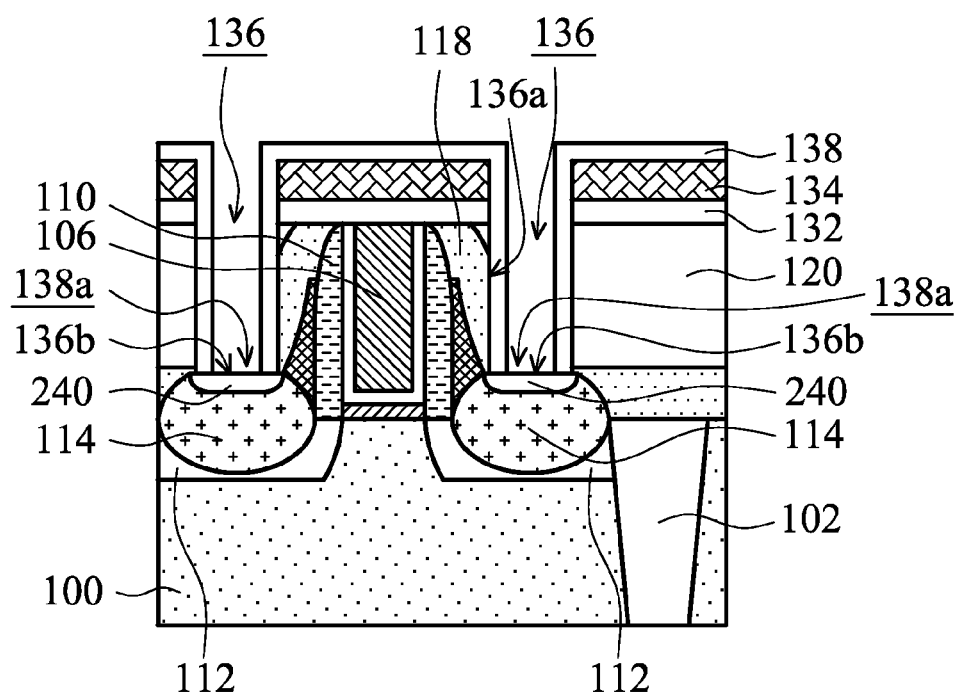

Thereafter, as shown in FIG. 2B, the DSL layer 138 is conformally deposited over the protective layer 134 and the sidewalls 136a and the bottoms 136b of the contact openings 136, in accordance with some embodiments. The DSL layer 138 may be formed on and be in direct contact with the amorphous regions 240.

Afterwards, an etching process is performed to remove a portion of the DSL layer 138 on the amorphous regions 240 so as to form the holes 138a of the DSL layer 138. The holes 138a expose the amorphous regions 240.

Figure 2C:
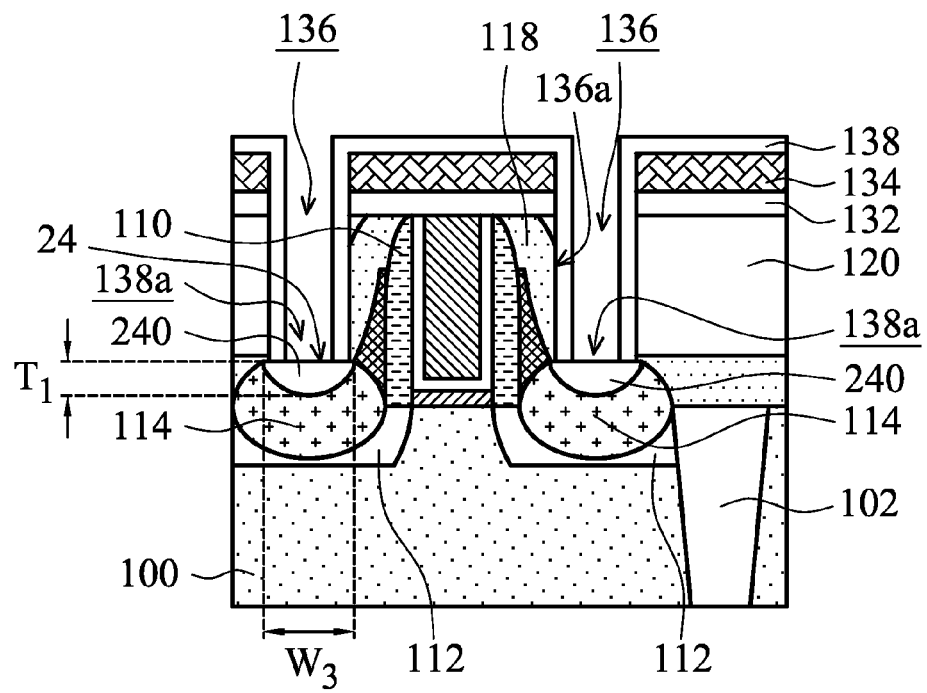

Afterwards, as shown in FIG. 2C, a second PAI process (also called a post-DSL PAI process) is performed to increase the thickness of the amorphous regions 240, in accordance with some embodiments. It should be noted that, the first PAI process forms the wide amorphous regions 240, and the second PAI process further increases the thickness of the amorphous regions 240. Therefore, the first PAI process and the second PAI process may form the amorphous regions 240 larger than the amorphous regions 140 as shown in FIG. 1C.

In some embodiments, the thickest portions of the amorphous regions 240 are under the holes 138a of the DSL layer 138, respectively. In some embodiments, the ratio of the width $W_3$ to the thickness $T_1$ ($W_3/T_1$) of the amorphous regions 240 is in a range from about 1.5 to about 2.5. The width $W_3$ and the thickness $T_1$ may be the largest width and the largest thickness of the amorphous regions 240, respectively. In some other embodiments, the second PAI process is optional.

In some embodiments, phosphorus (P), xenon (Xe), carbon (C), germanium (Ge), boron fluoride ($BF_2$), arsenic (As), or fluorine (F) is used in the second PAI process. In some embodiments, the implantation energy of the second PAI process ranges from about 1 KeV to about 10 KeV. In some embodiments, the implantation dose of the second PAI process ranges from about 500E3 $cm^{-3}$ to about 500E7 $cm^{-3}$. In some embodiments, the implantation angle of the second PAI process ranges from about 0° to about 30°, wherein the implantation angle is relative to a normal line of the top surfaces 24 of the amorphous regions 240.

Figure 2D:
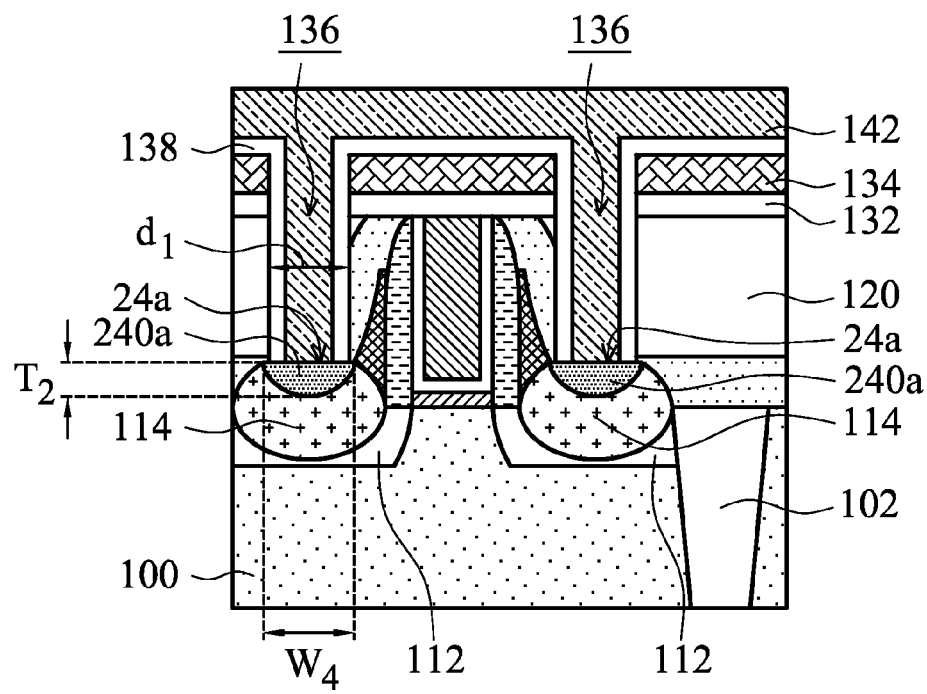

Thereafter, as shown in FIG. 2D, a salicidation (self-aligned silicidation) process is performed on the amorphous regions 240 to turn the amorphous regions 240 into metal silicide regions 240a, in accordance with some embodiments. The DSL layer 138 may be in direct contact with the metal silicide regions 240a. Then, an un-reacted portion of a deposited metal film (not shown) for forming the metal silicide regions 240a is removed by using, for example, an etching process.

In some embodiments, the width $W_4$ of the metal silicide region 240a is larger than the diameter $d_1$ of the contact opening 136. In some embodiments, the ratio of the width $W_4$ to the diameter $d_1$ ($W_4/d_1$) ranges from about 1.3 to about 2.3. In some embodiments, the contact openings 136 merely expose a portion of top surfaces 24a of the metal silicide region 240a, respectively.

In some embodiments, the width $W_4$ of the metal silicide region 240a is larger than the thickness $T_2$ of the metal silicide region 240a. In some embodiments, the ratio of the width $W_4$ to the thickness $T_2$ ($W_4/T_2$) is in a range from about 1.5 to about 2.5.

As described above, the first PAI process and the second PAI process may form the amorphous regions 240 larger than the amorphous regions 140 shown in FIG. 1C. Therefore, the amorphous regions 240 may have a sufficient size to prevent the doped impurities of the salicidation process from channeling through spaces within the crystal lattice structure and reaching depths greater than desired. Thereby, the Ion/Ioff ratio is improved.

Besides, as shown in FIG. 2D, the larger amorphous regions 240 are turned into the metal silicide regions 240a, and therefore the metal silicide regions 240a is larger than the metal silicide regions 140a (as shown in FIG. 1D). Therefore, the metal silicide regions 240a with a larger size may reduce the contact resistance between the metal silicide regions 240a and contact plugs subsequently formed.

As shown in FIG. 2D, a conductive layer 142 is deposited on the protective layer 134 and is filled into the contact openings 136 to electrically contact with the metal silicide regions 240a. The conductive layer 142 is deposited by, for example, a PVD process or other suitable processes. The conductive layer 142 is made of, for example, tungsten or other suitable conductive materials.

Figure 2E:
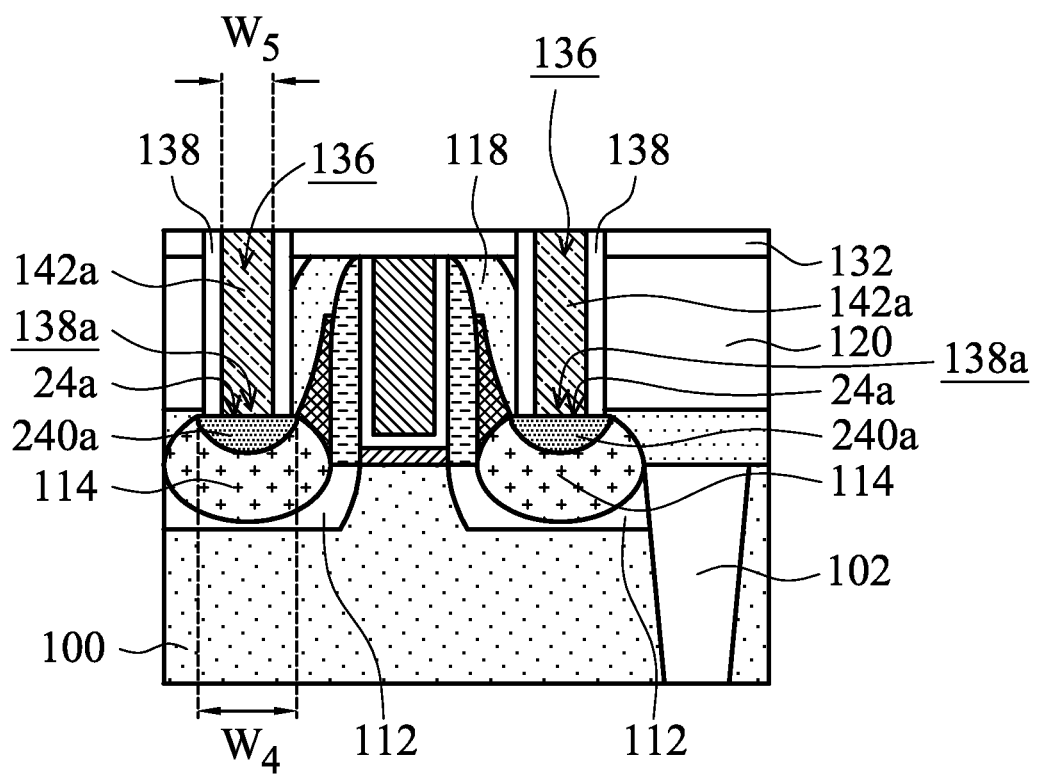

As shown in FIG. 2E, a chemical mechanical polishing (CMP) process is performed to remove the conductive layer 142 and the DSL layer 138 outside of the contact openings 136, and the protective layer 134. After the CMP process, the conductive layer 142 remaining in the contact openings 136 therefore forms contact plugs 142a electrically connecting the metal silicide regions 240a and the doped regions 112 (i.e. the S/D regions). In some embodiments, after the CMP process, the whole of the DSL layer 138 remaining in the contact openings 136 is right above the metal silicide regions 240a. In some embodiments, the width W4 of the metal silicide region 240a is larger than the width W5 of the contact plug 142a.

As shown in FIG. 2E, a semiconductor device 200 is formed. The semiconductor device 200 may be an n-type metal-oxide-semiconductor field-effect transistor (MOSFET) or a p-type MOSFET.

Embodiments of mechanisms for forming a semiconductor device described above perform the first and the second PAI processes before and after the formation of the DSL layer to increase the size of the amorphous regions. Therefore, the amorphous regions may have a sufficient size to prevent the doped impurities of the salicidation process from channeling and reaching depths greater than desired. Thereby, the $I_{on}/I_{off}$ ratio is improved. The metal silicide regions formed from the amorphous regions may also have a larger size to reduce the contact resistance between the metal silicide regions and the contact plugs.

In accordance with some embodiments, a semiconductor device is provided. The semiconductor device includes a semiconductor substrate. A source region and a drain region are formed in the semiconductor substrate, and metal silicide regions are formed in the source region and the drain region, respectively. The semiconductor device further includes a metal gate stack formed over the semiconductor substrate and between the source region and the drain region. The semiconductor device also includes an insulating layer formed over the semiconductor substrate and surrounding the metal gate stack, wherein the insulating layer has contact openings exposing the metal silicide regions, respectively. The semiconductor device includes a dielectric spacer liner layer formed over inner walls of the contact openings, wherein the whole of the dielectric spacer liner layer is right above the metal silicide regions. The semiconductor device includes contact plugs formed in the contact openings.

In accordance with some embodiments, a semiconductor device is provided. The semiconductor device includes a semiconductor substrate. A source region and a drain region are formed in the semiconductor substrate, and metal silicide regions are formed in the source region and the drain region, respectively. The semiconductor device also includes a metal gate stack formed over the semiconductor substrate and between the source region and the drain region. The semiconductor device further includes an insulating layer formed over the semiconductor substrate and surrounding the metal gate stack. The insulating layer has contact openings exposing a portion of top surfaces of the metal silicide regions, respectively. The semiconductor device also includes a dielectric spacer liner layer formed over inner walls of the contact openings. The semiconductor device further includes contact plugs formed in the contact openings.

In accordance with some embodiments, a method for forming a semiconductor device is provided. The method includes providing a semiconductor substrate, a metal gate stack, and an insulating layer formed over the semiconductor substrate. A source region and a drain region are formed in the semiconductor substrate, the metal gate stack is between the source region and the drain region, and the insulating layer surrounds the metal gate stack. The method also includes forming contact openings passing through the insulating layer to expose the source region and the drain region, respectively. The method further includes performing a first pre-amorphized implantation process to form amorphous regions in the source region and the drain region exposed by the contact openings. The method also includes after the first pre-amorphized implantation process, forming a dielectric spacer liner layer on sidewalls of the contact openings.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device, comprising:
    a semiconductor substrate, wherein a source region and a drain region are formed in the semiconductor substrate, and metal silicide regions are formed in the source region and the drain region, respectively;
    a metal gate stack formed over the semiconductor substrate and between the source region and the drain region, wherein the metal gate stack comprises a gate electrode and a work function metal layer, and the work function metal layer covers a sidewall and a bottom surface of the gate electrode;
    an insulating layer formed over the semiconductor substrate and surrounding the metal gate stack, wherein the insulating layer has contact openings exposing the metal silicide regions, respectively, and a first pre-amorphized implantation element is implanted in the metal silicide regions and the insulating layer adjacent to the contact openings, wherein the first pre-amorphized implantation element includes phosphorus (P), xenon (Xe), carbon (C), germanium (Ge), boron fluoride ($BF_2$), arsenic (As), or fluorine (F);
    a dielectric spacer liner layer formed over inner walls of the contact openings, wherein the whole of the dielectric spacer liner layer is right above the metal silicide regions, and a second pre-amorphized implantation element is implanted in the metal silicide regions and the dielectric spacer liner layer; and
    contact plugs formed in the contact openings.

2. The semiconductor device as claimed in claim 1, wherein a width of the metal silicide region is larger than a diameter of the contact opening.

3. The semiconductor device as claimed in claim 2, wherein a ratio of the width of the metal silicide region to the diameter of the contact opening ranges from about 1.3 to about 2.3.

4. The semiconductor device as claimed in claim 1, wherein a width of the metal silicide region is larger than a thickness of the metal silicide region.

5. The semiconductor device as claimed in claim 4, wherein a ratio of the width to the thickness of the metal silicide region is in a range from about 1.5 to about 2.5.

6. The semiconductor device as claimed in claim 1, wherein a width of the metal silicide region is larger than a width of the contact plug.

7. The semiconductor device as claimed in claim 1, wherein the dielectric spacer liner layer is in direct contact with the metal silicide regions.

8. The semiconductor device as claimed in claim 1, further comprising:
   stressors formed in the source region and the drain region, respectively, wherein the metal silicide regions are formed in the stressors.

9. The semiconductor device as claimed in claim 1, wherein the contact plugs electrically connect the metal silicide regions.

10. The semiconductor device as claimed in claim 1, wherein the metal silicide regions are made of a silicide material of a metal material, and the metal material comprises nickel, cobalt, platinum, titanium, ytterbium, molybdenum, or erbium.

11. A semiconductor device, comprising:
   a semiconductor substrate, wherein a source region and a drain region are formed in the semiconductor substrate, and metal silicide regions are formed in the source region and the drain region, respectively;
   a metal gate stack formed over the semiconductor substrate and between the source region and the drain region, wherein the metal gate stack comprises a gate electrode and a work function metal layer, and the work function metal layer covers a sidewall and a bottom surface of the gate electrode;
   an insulating layer formed over the semiconductor substrate and surrounding the metal gate stack, wherein the insulating layer has contact openings exposing a portion of top surfaces of the metal silicide regions, respectively, and a first pre-amorphized implantation element is implanted in the metal silicide regions and the insulating layer adjacent to the contact openings, wherein the first pre-amorphized implantation element includes phosphorus (P), xenon (Xe), carbon (C), germanium (Ge), boron fluoride ($BF_2$), arsenic (As), or fluorine (F);
   a dielectric spacer liner layer formed over inner walls of the contact openings, wherein a second pre-amorphized implantation element is implanted in the metal silicide regions and the dielectric spacer liner layer; and
   contact plugs formed in the contact openings.

12. The semiconductor device as claimed in claim 11, wherein a ratio of a width of the metal silicide region to a diameter of the contact opening ranges from about 1.3 to about 2.3.

13. The semiconductor device as claimed in claim 11, wherein a ratio of a width to a thickness of the metal silicide region is in a range from about 1.5 to about 2.5.

14. The semiconductor device as claimed in claim 11, wherein a width of the metal silicide region is larger than a width of the contact plug.

15. The semiconductor device as claimed in claim 11, wherein the whole of the dielectric spacer liner layer is right above the metal silicide regions.

16. The semiconductor device as claimed in claim 11, wherein a width of the metal silicide region is larger than a diameter of the contact opening.

17. The semiconductor device as claimed in claim 11, wherein a width of the metal silicide region is larger than a thickness of the metal silicide region.

18. The semiconductor device as claimed in claim 11, wherein the dielectric spacer liner layer is in direct contact with the metal silicide regions.

19. The semiconductor device as claimed in claim 11, further comprising:
   stressors formed in the source region and the drain region, respectively, wherein the metal silicide regions are formed in the stressors.

20. The semiconductor device as claimed in claim 11, wherein the contact plugs electrically connect the metal silicide regions.

* * * * *